US005277754A

United States Patent [19]

Hadimioglu et al.

[11] Patent Number: 5,277,754

[45] Date of Patent: Jan. 11, 1994

[54] PROCESS FOR MANUFACTURING LIQUID LEVEL CONTROL STRUCTURE

[75] Inventors: Babur B. Hadimioglu, Mountain View; Butrus T. Khuri-Yakub, Palo Alto, both of Calif.

[73] Assignee: Xerox Corporation, Stamford, Conn.

[21] Appl. No.: 978,848

[22] Filed: Nov. 19, 1992

Related U.S. Application Data

[62] Division of Ser. No. 810,248, Dec. 19, 1991.

[51] Int. Cl.$^5$ ...................... H01L 21/306; B44C 1/22; C03C 15/00; C03C 25/06

[52] U.S. Cl. .................................... 156/644; 156/643; 156/647; 156/657; 156/659.1; 156/661.1; 156/662; 346/140 R

[58] Field of Search ............... 156/628, 643, 644, 647, 156/650, 653, 654, 656, 657, 659.1, 661.1, 662; 346/1.1, 140 R, 141, 076 R

[56] References Cited

U.S. PATENT DOCUMENTS 5,204,690 4/1993 Lorenze et al. ...................... 346/1.1

*Primary Examiner*—William A. Powell
*Attorney, Agent, or Firm*—John M. Kelly

[57] ABSTRACT

A liquid level control structure and a method for its production. The controller is comprised of a plate having substantially flat top and bottom surfaces and an hourglass-shaped aperture containing a marking fluid. Protruding a known amount and at a known angle from opposite sides of the aperture waist are knife-edged lips that interact with the fluid's surface tension to control the location of an unbounded surface of the fluid.

The method for producing the liquid level control structure uses semiconductor fabrication techniques. The aperture is formed in a semiconductor wafer using several etching steps, some of which act along the crystalline planes of the wafer. The lips are formed from etch stop layers deposited between etching steps, while the knife-edges are formed on the ends of the lips during an etching step. Beneficially, the location of the knife-edges relative to one surface of the wafer is independent of small variations in the thickness of the water.

4 Claims, 6 Drawing Sheets

PROCESS FOR MANUFACTURING LIQUID LEVEL CONTROL STRUCTURE

This is a division of application Ser. No. 07/810,248, filed Dec. 19, 1991.

The present invention relates to the positioning of unbounded liquid surfaces.

BACKGROUND OF THE PRESENT INVENTION

Because acoustic ink printers (AIP) avoid the clogging and manufacturing problems of conventional drop-on-demand, nozzle-based ink jet printers, they represent a promising direct marking technology. While significant effort has gone into developing acoustic ink printing, see, for example, U.S. Pat. Nos. 4,751,530; 4,751,534; 5,028,937; and 5,041,849, problems remain.

An acoustic ink printer utilizes acoustic energy to eject droplets from an unbounded surface of a marking fluid onto a recording surface. Typically, this involves focusing acoustic energy from an ultrasonic transducer using either spherical or fresnel (reference U.S. Pat. No. 5,041,849) acoustic lenses into a focal area near the unbounded surface. If the acoustic energy is sufficient, an ink droplet (having a diameter about the size of the wavelength) is ejected. For a more detailed description of the ejection process reference is made to U.S. Pat. Nos. 4,308,547 and 5,028,937, and the citations therein.

As can be appreciated, acoustic ink printers are sensitive to the spacing between the acoustic energy's focal plane and the unbounded surface of the liquid. Since the focal plane is generally fixed, it is important that the unbounded surface be positioned near the focal plane. Indeed, since current practice dictates that the focal plane be within about one wavelength of the unbounded surface, and since typical wavelengths are about 10 micrometers, the location of the unbounded surface must be very accurately controlled. U.S. Pat. No. 5,028,937 discussed controlling the location of the unbounded surface using a perforated membrane. However, that solution may not be optimum.

It would be beneficial to have a device that accurately controls the location of the unbounded surface of a liquid, that is producible at low cost, and that allows droplets to be ejected onto a recording medium.

SUMMARY OF THE INVENTION

In accordance with the present invention there is provided a liquid level control structure having an aperture for holding a liquid, beneficially an ink. The aperture is defined by inwardly sloping lower and upper surfaces which meet at a waist. Controlled-length lips that terminate in knife-edges project upwardly from each side of the waist into the aperture. The lips provide a framework for controlling the location of the liquid's unbounded surface via the liquid's surface tension. Beneficially, the position of the knife-edges relative to the bottom surface of the structure is accurately controlled.

The liquid level control structure is beneficially produced from a silicon <100> wafer using semiconductor fabrication techniques. Etch protective stop layers, preferably of nitride, are deposited over the top and bottom wafer surfaces. Where the aperture is desired, a slot is formed through the bottom stop layer to expose part of the wafer's bottom surface. The wafer is then anisotropically etched along its crystalline planes, beneficially using KOH, from the exposed part of the bottom surface (preferably stopping adjacent the top stop layer), thereby forming a first trough-like structure. An etch protective stop layer, such as nitride, and a metal deposition layer, beneficially of chrome, are then deposited over the surfaces of the first trough-like structure. A relatively narrow slot, aligned with the first trough-like structure, is then formed through the top stop layer to expose part of the wafer's top surface. Dry etching, beneficially using reactive ion etching along an angle normal to the wafer's top surface, is then performed from the narrow slot down through the top part of the aperture and the nitride layer, forming an elongated hole. The elongated hole widens the top part of the first trough-like structure and cuts the nitride layer to fixed lengths that terminate with wedge-shaped ends. A section of the top stop layer adjacent the elongated hole is removed to expose a new part of the top wafer surface. The wafer is then anisotropically etched along its crystalline planes from the exposed top surface downward toward the bottom surface, thereby forming a second trough-like structure. As etching continues, the first and second trough-like structures meet to form a waist. Further etching of the second trough-like structure undercuts the lower nitride layer, expands the waist, and leaves upwardly protruding knife-edged lips (formed by the nitride layer) in the aperture. The lips extend into the aperture at an angle controlled by the crystalline planes and at a distance controlled by the etching process. The metallic layer is then removed, resulting in the completed liquid level control structure.

The liquid level control structure beneficially mounts directly onto a substantially flat body which holds an array of acoustic lenses focused to a plane at a known distance above the body. By controlling the etching parameters, the lips are formed such that the unbounded surface of the liquid locates at or very near the acoustic focal plane. Beneficially, the position where the liquid locates is substantially independent of the wafer's thickness.

BRIEF DESCRIPTION OF THE DRAWINGS

Other aspects of the present invention will become apparent as the following description proceeds and upon reference to the drawings, in which.

Figure 1:
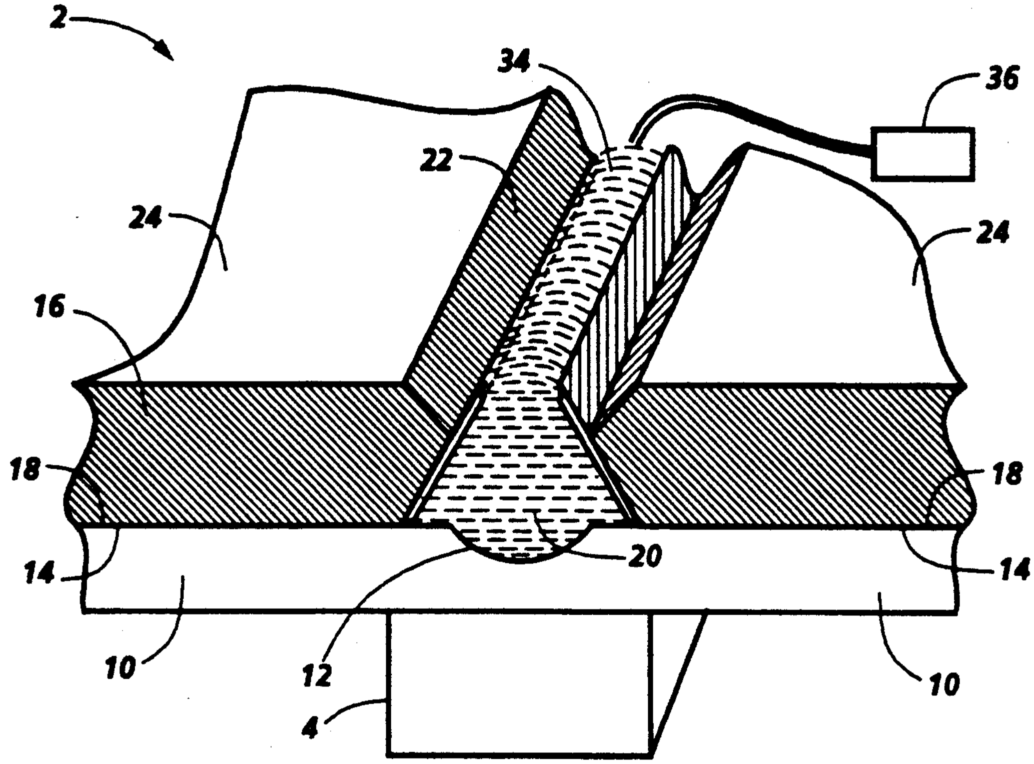
FIG. 1 illustrates an unscaled and fragmentary sectional view of an acoustical droplet ejector according to the principles of the present invention.

Note that in the drawings, like numbers designate like elements. Additionally, note that for explanatory convenience the text of this document makes reference to up and down, top and bottom, lower and upper, and other such relative directional signals. These signals are meant to aid the reader in understanding the present invention, not to limit it. For example, while the subsequently described acoustic droplet ejector is shown and discussed as ejecting ink droplets upward, in practice the acoustic droplet ejector may well be orientated such that ink droplets are ejected sideways.

DETAILED DESCRIPTION OF THE ILLUSTRATED EMBODIMENT

While the present invention is described in connection with an acoustic droplet ejector, it is to be understood that the present invention is not intended to be limited to that embodiment. On the contrary, the present invention is intended to cover all alternatives, modifications, and equivalents as may be included within the scope of the appended claims.

Refer now to FIG. 1 where an acoustic droplet ejector 2 according to the principles of the present invention is illustrated. When ejecting droplets, electrical energy is selectively applied to individual transducers 4 of a linear array of ultrasonic transducers (only one transducers shown, the others being disposed along the subsequently described aperture) as required to produce the desired droplet ejection pattern. In response, those energized transducers generate acoustic energy that passes from the transducer into a body 10. The acoustic energy continues through the body until it illuminates an acoustic lens 12 within an array of substantially identical acoustic lenses (only one lens shown, the others being disposed in a line along the axis of the subsequently described aperture). The lens array is disposed on a flat surface 14 of the body 10 and is orientated such that the majority of acoustic energy from one transducer illuminates only one acoustic lens. Each acoustic lens 12 focuses its illuminating acoustic energy into a small area of an acoustic focal plane that is a predetermined distance above the top surface 14.

Figure 2:
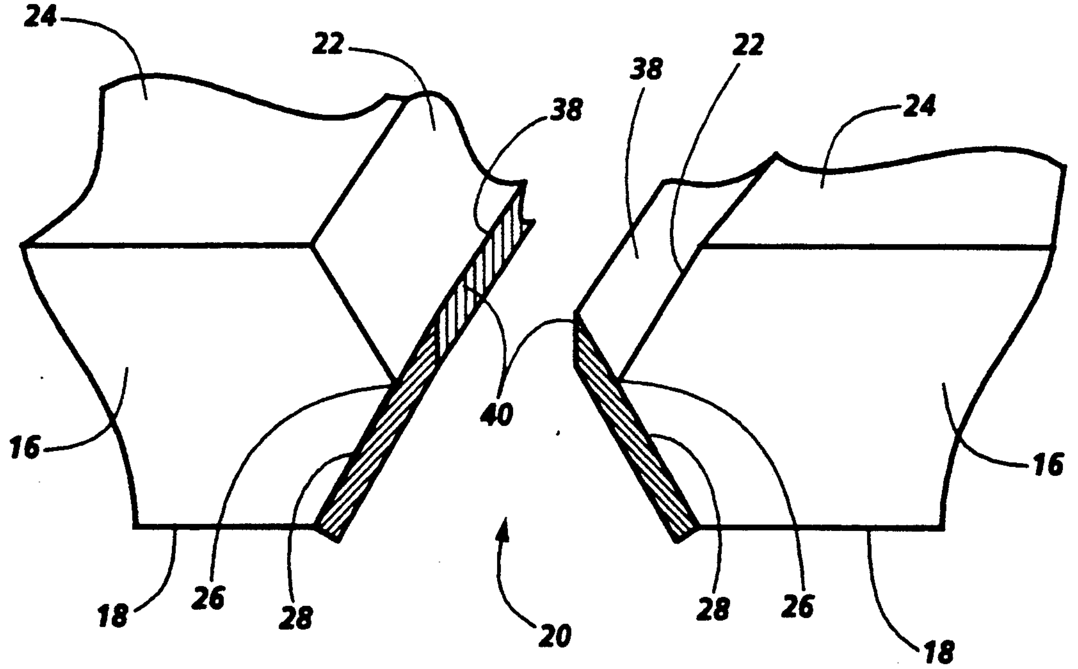
FIG. 2 is an enlarged view of the liquid level control structure of FIG. 1.

Referring now to FIGS. 1 and 2, the acoustic droplet ejector 2 also includes a liquid level control structure 16 having a bottom surface 18 which couples to the top surface 14. The liquid level control structure has an elongated aperture 20 disposed such that it aligns with the acoustic lenses 12 and transducers 4 and such that each acoustic lens' cone of focus is within the aperture. The aperture 20 is defined by inwardly sloping upper surfaces 22 that extend down from the top 24 of the liquid level control structure 16 and which meet, forming a waist 26, with inwardly sloping lower surfaces 28 that extend up from the bottom surface 18. Referring now to FIG. 1, the aperture 20 forms a fluid channel for holding a liquid ink 34. The ink in the aperture is slightly pressurized by a pressure means 36 which replenished ink in the aperture 20 as droplets are ejected.

Referring back to FIG. 2, the position of the unbounded ink surface is controlled by lips 38 within the aperture. These lips terminate in knife-edges 40 and provide reference frameworks that interact with the surface tension of the ink 34 to fix the position of the unbounded ink surface. Thus, by accurately positioning the knife-edges the unbounded ink surface can be spatially fixed relative to the acoustic focal plane. The position of the knife-edges relative to the acoustic focal plane is controlled by 1) mounting the bottom surface 18 directly on the top surface 14, 2) accurately dimensioning the aperture openings at the bottom surface, 3) accurately controlling the angle of the lower surfaces 28 relative to the bottom surface, 4) accurately controlling the distance along the lower surface from the bottom surface to the ends of the lips, and 5) removing material above the lips to free the knife-edges. While other techniques conceivably could be used, the liquid level control structure 16 is beneficially produced using semiconductor fabrication technology.

Figure 3A:
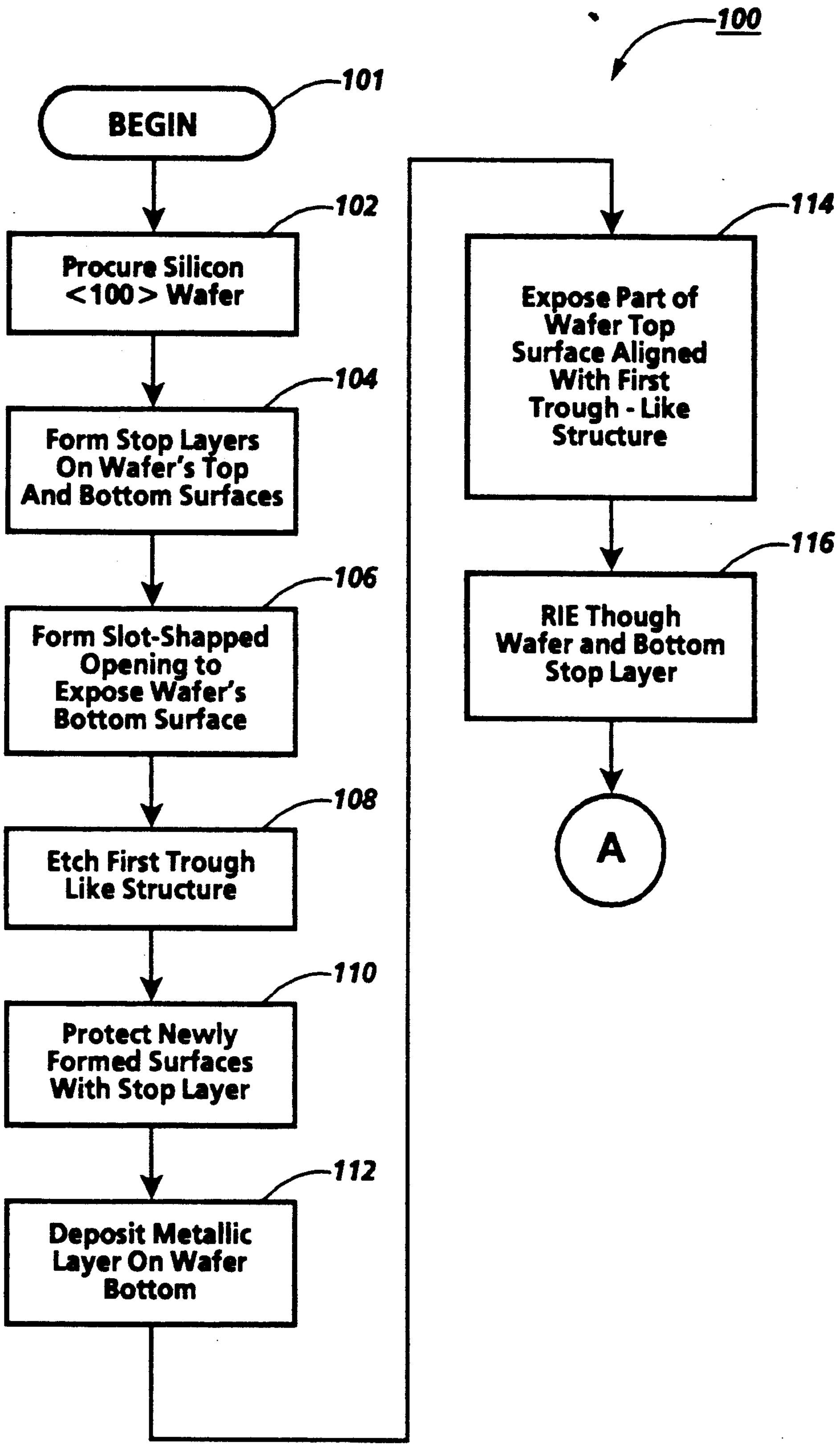
FIGS. 3A and 3B show a flow chart of the steps of producing the liquid level control structure of FIG. 1.
Figure 3B:
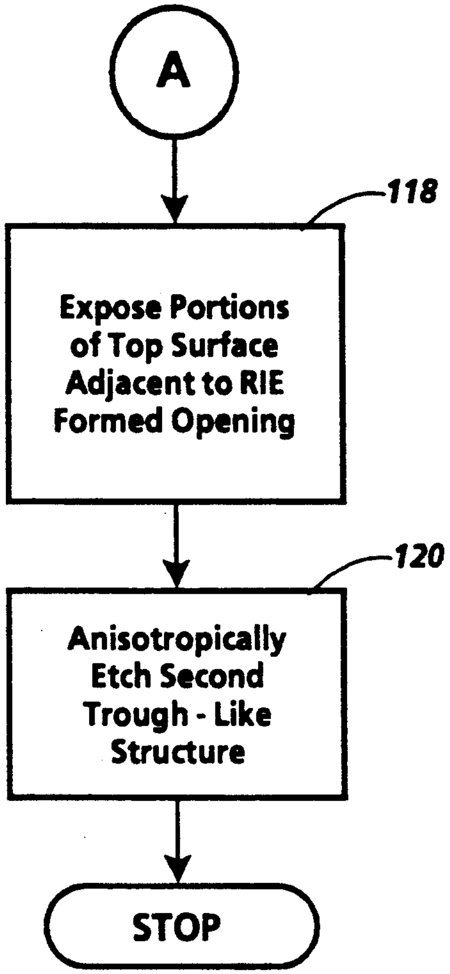
Figure 4:
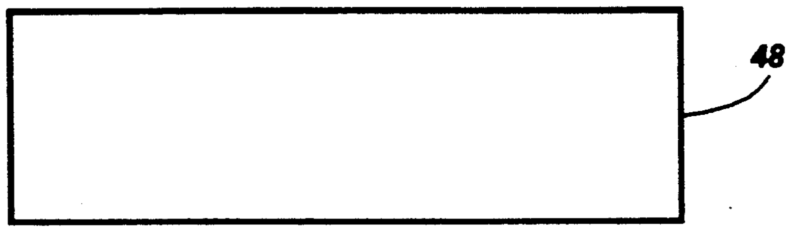
FIG. 4 is a plan view of a small section of a silicon <100> wafer that will be processed according to the flow chart of FIG. 3.
Figure 5:
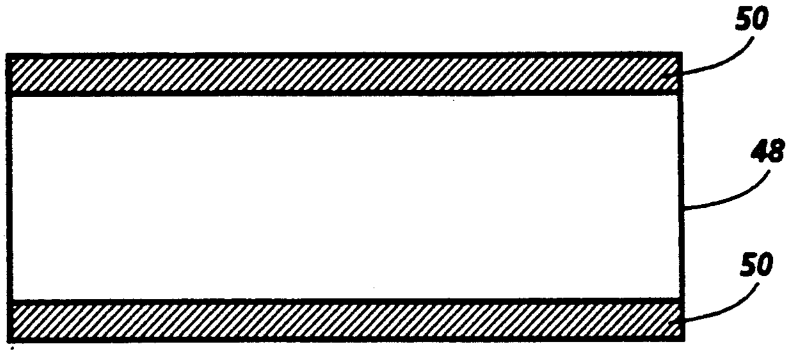
FIG. 5 shows the wafer of FIG. 4 with etch stop layers deposited on its top and bottom surfaces.

A suitable method 100 for manufacturing the liquid level control structure 16 is illustrated in FIG. 3, with the assistance of FIGS. 4 through 13. The method begins, step 101, and proceeds with the procurement of a silicon <100> wafer 48, step 102 and FIG. 4. Etch stop layers 50, protective coatings that inhibit subsequent etching, are then formed over both the top and bottom surfaces of the wafer, step 104 and FIG. 5. Beneficially, the etch stop layers are nitride, but other stop layers such as p-type boron doping may be used. However, a nitride layer on the bottom surface beneficially assists the subsequent processing steps.

Figure 6:
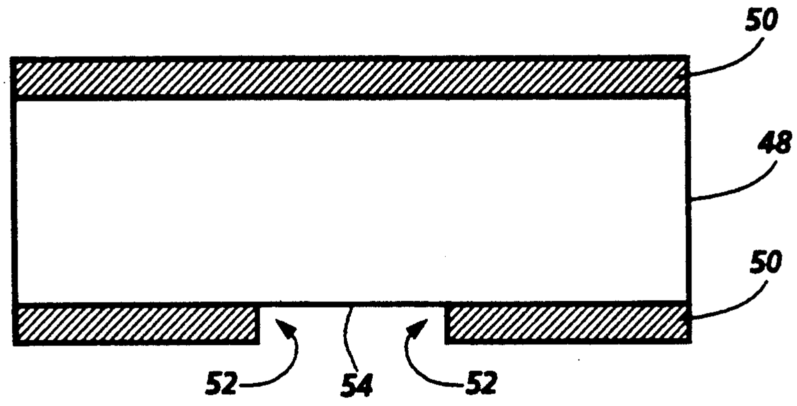
FIG. 6 shows the wafer of FIG. 5 with a slot formed through the bottom etch stop layer.
Figure 7:
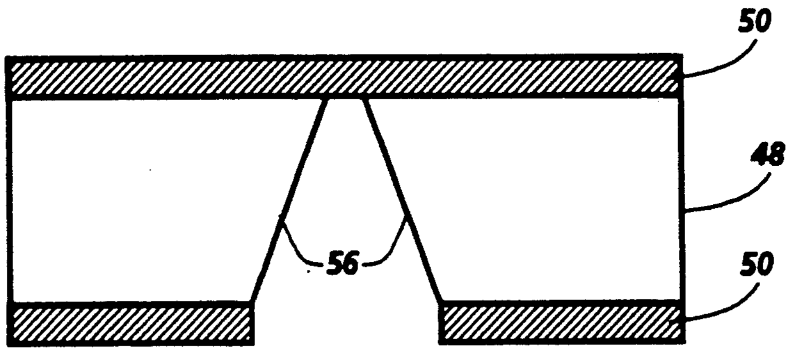
FIG. 7 shows the first trough-like structure formed at the slot shown in FIG. 6.
Figure 8:
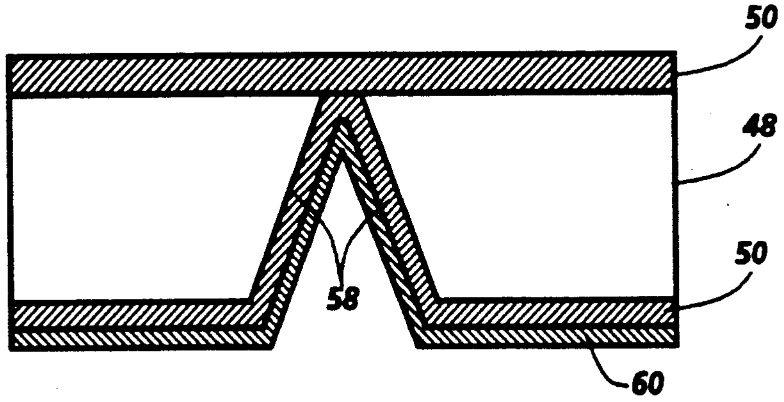
FIG. 8 shows the wafer per FIG. 7 after deposition of nitride and metallic layers over the surfaces of the first trough-like structure.

With the etch stop layers in place, an accurately dimensioned slot 52 is formed using standard photolithographic techniques through the bottom etch stop layer 50 at the desired aperture location, step 106 and FIG. 6. This slot, which will define the lower aperture opening, exposes a portion 54 of the bottom wafer surface to chemical action. The wafer is then anisotropically etched using a suitable etchant (such as potassium hydroxide) along its crystalline planes to produce a first trough-like structure 56 that passes through the wafer 48, step 108 and FIG. 7. This trough-like structure 56 is larger at bottom then at its top, and thus inwardly sloping lower surfaces are formed. To protect the newly formed inwardly sloping lower surfaces, an etch stop layer 58 is placed over them, step 110 and FIG. 8. The etch stop layer 58 can be comprised of a range of materials and may be created as one layer or several. For example, the etch stop layer 58 can be formed by (1) boron doping the newly formed surfaces to create a thin p-type layer, and (2) depositing a nitride layer over the boron doped layer. Since the etch stop layer 58 eventually forms the lips 38 (as described below), since a boron doped silicon layer would survive subsequent operations, and since silicon has better mechanical strength than nitride, lips formed by boron doping and nitride deposition have improved mechanical characteristics over lips formed simply by nitride deposition. However, the additional steps required to form the boron doped layer may override their advantages. In any event, a protective metallic layer 60 (preferably of chrome) is deposited over the bottom etch stop layers 50 and 58, step 112 (also shown in FIG. 8).

Figure 9:
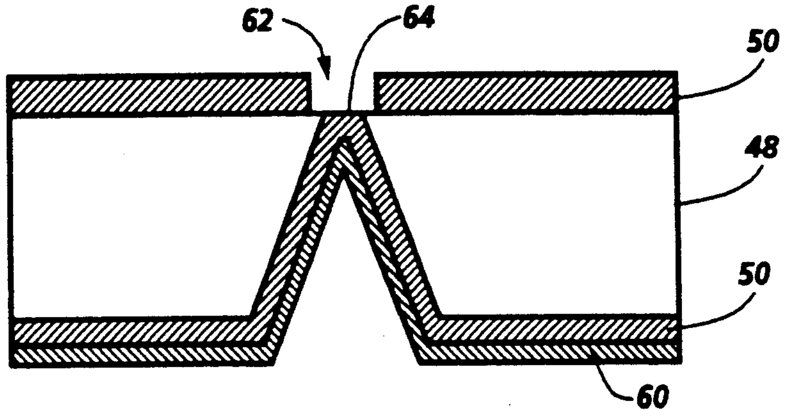
FIG. 9 shows the wafer per FIG. 8 after exposure of a narrow slot of the top surface of the wafer.
Figure 10:
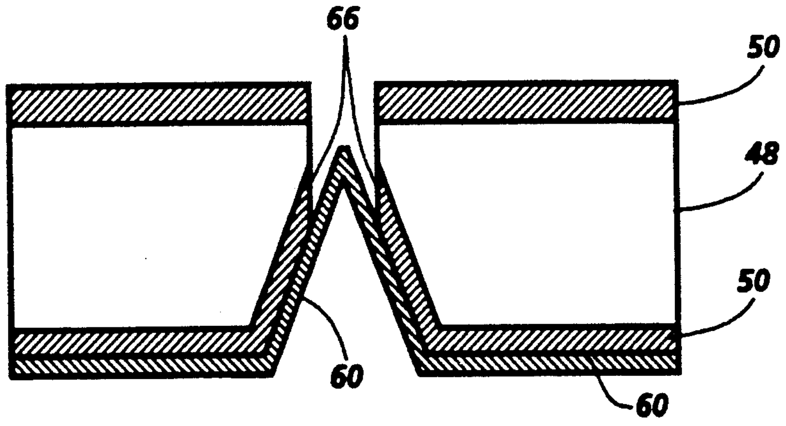
FIG. 10 shows the wafer per FIG. 9 after RIE etching.
Figure 11:
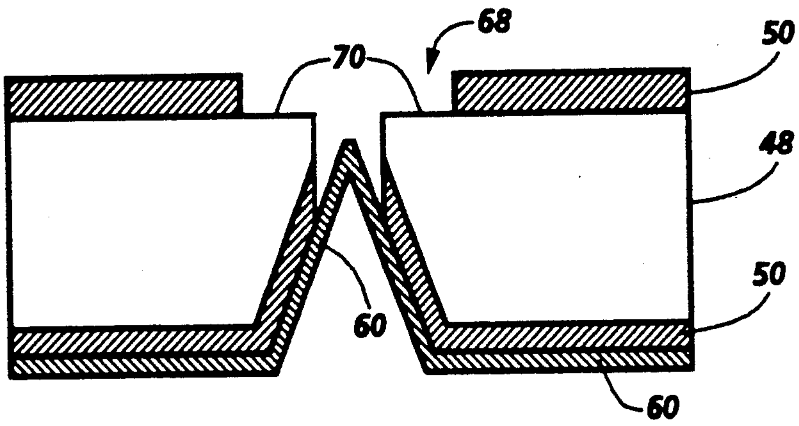
FIG. 11 shows the wafer per FIG. 10 after exposure of more of the wafer top surface.
Figure 12:
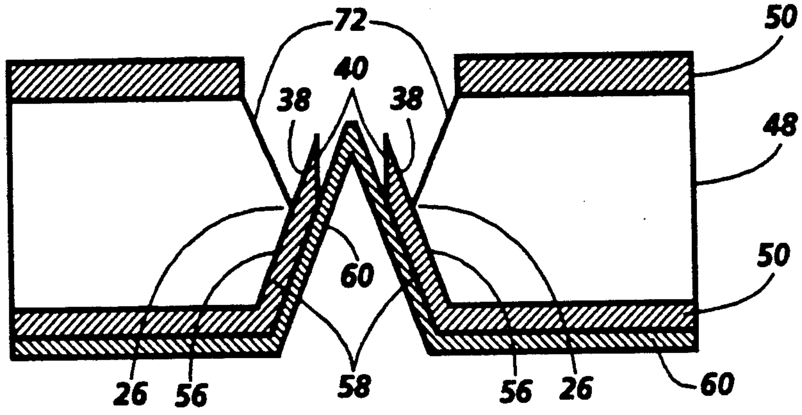
FIG. 12 shows the wafer per FIG. 11 after the etching of the second trough-like structure.
Figure 13:
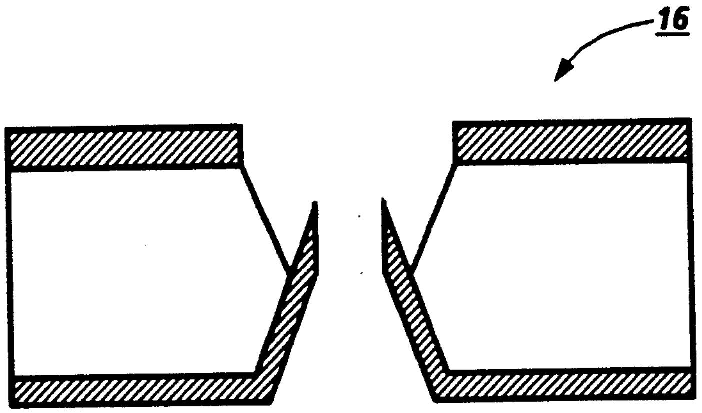
FIG. 13 shows the wafer per FIG. 12 after removal of the chrome layer.

A narrow, elongated slot 62 aligned with the first trough-like structure is then photolithographically formed through the top etch stop layer, thereby exposing a part 64 of the top wafer surface, step 114 and FIG. 9. Dry etching, such as reactive ion etching (RIE), is then performed from the newly exposed top wafer surface downward to the metallic layer 60, step 116 and FIG. 10. This dry etching process widens the upper part of the first trough-like structure and leaves the nitride layer 58 with wedge-shaped faces 66. An elongated opening 68 adjacent to the top of the dry etched enlarged holes is then photolithographically formed through the top etch stop layer 50, exposing new portions of the wafer top surface 70, step 118 and FIG. 11. The wafer is again anisotropically etched, this time from the top side downward, step 120. This etch forms a second trough-like structure 72 (reference FIG. 12) that eventually melds into the first trough-like structure 56. When the dry etching process reaches the etch stop layer 58, it forms the waist 26. Etching continues anisotropically (thereby moving the waist) until the lips 38 with knife-edges 40 are formed from the etch stop layer 58, reference FIG. 12. Finally, the metallic layer 60 is removed, leaving the completed liquid level control structure 16, and the process is stopped, step 122 and FIG. 13.

As can be appreciated from the above description and the accompanying drawings, the height of the knife-edges 40 above the bottom surface 18 (reference FIG. 2) is determined principally by three parameters: 1) the width of the slot formed in step 104, 2) the angle of the anisotropic etching, which is controlled by the crystalline properties of the wafer, and 3) the width of the opening formed in step 116. It is specifically noted that the location of the knife-edges relative to the bottom surface 18 is independent of minor variations in the wafer thickness. This permits a relaxation in the tolerances of the wafer thickness, which results in a lower cost wafer. Because the location of the knife-edges relative to a bottom surface, and consequently the position of the ink surface, depends upon a physical property and highly accurate lithography, expensive machining operations are avoided. The net result is a cost effective, close tolerance liquid level control structure.

The acoustic droplet ejector 2 is described above as having a plurality of transducers 4 and acoustic lenses 12, all aligned along the axis of the aperture 20. Beneficially, the aperture spans the full width of a sheet of paper, say about 8.5 inches, while the transducers are spaced according to the desired center-to-center spot spacing. However, other acoustic droplet ejectors can be made with longer or shorter apertures, or with a plurality of apertures, such as an acoustic droplet ejector comprised of several parallel apertures that have transducers and lenses which produce offset spots.

From the foregoing, numerous modifications and variations of the principles of the present invention will be obvious to those skilled in its art. Therefore the scope of the present invention is to be defined by the appended claims.

What is claimed is:

1. A method of fabricating a liquid level controller from a wafer having opposed first and second outer surfaces and a body comprised of a material having crystalline planes of orientation, said method comprising the steps of:

(a) depositing etch protective stop layers on the first and second outer surfaces;

(b) removing a portion of the etch protective stop layer on the first outer surface to expose a portion of the first outer surface to chemical action;

(c) forming a first trough defined by first inner surfaces by anisotropically etching the exposed portion of the first outer surface along certain ones of the crystalline planes;

(d) depositing an etch protective stop layer over the first inner surfaces;

(e) removing a portion of the etch protective stop layer on the second outer surface to expose a first portion of the second outer surface to chemical action, the exposed first portion being aligned with the first trough;

(f) etching a hole through the wafer from the exposed first portion through the etch protective stop layer deposited in said step (d);

(g) removing a portion of the etch protective stop layer on the second outer surface to expose a second portion of the second outer surface to chemical action, the exposed second portion being adjacent to the hole etched in step (f); and (h) forming a second trough defined by second inner surfaces by anisotropically etching the exposed second portion along certain ones of the crystalline planes, the second trough extending from the exposed second portion to the etch protective stop layer deposited in step (d) such that part of the etch protective stop layer deposited in step (d) extends into the aperture defined by the first and second troughs and the hole.

2. The method according to claim 1 wherein step (f) creates a knife-edge on the ends of the etch protective stop layer deposited in step (d).

3. The method according to claim 2, further including the steps of depositing prior to step (h) an etch resistant metallic coating over the etch protective stop layer formed in step (d), and removing the etch resistant metallic coating after step (h).

4. A silicon liquid level control structure manufactured by:

(a) depositing etch protective stop layers over first and second outer surfaces of a silicon <100> wafer;

(b) exposing a portion of the first outer surface to chemical action;

(c) forming a first trough defined by first inner surfaces by anisotropically etching the exposed portion of the first outer surface along certain ones of the wafer's crystalline planes;

(d) depositing an etch protective stop layer over the first inner surfaces;

(e) depositing an etch resistant metallic coating over the etch protective stop layer deposited in step (d);

(f) exposing to chemical action a first portion of the second outer surface, the first portion being aligned with the first trough;

(g) etching a hole from the exposed first portion of the second outer surface through the etch protective stop layer deposited in step (d), thereby defining a top hole opening;

(h) exposing to chemical action a second portion of the second outer surface, the second portion being adjacent to the top hole opening and aligned with the first trough; and (i) forming a second trough defined by second inner surfaces by anisotropically etching the exposed second portion along certain ones of the wafer's crystalline planes, the second trough extending from the second portion to the etch protective stop layer deposited in step (d) such that part of the etch protective stop layer deposited in step (d) extends into the aperture defined by the first and second troughs and the hole.

* * * * *